United States Patent
Lee et al.

(10) Patent No.: US 10,454,445 B2
(45) Date of Patent: Oct. 22, 2019

(54) COMMON MODE FILTER

(71) Applicant: SAMSUNG ELECTRO-MECHANICS CO., LTD., Suwon-Si, Gyeonggi-Do (KR)

(72) Inventors: Sang Moon Lee, Suwon-Si (KR); Bon Seok Koo, Suwon-si (KR); Kun Hoi Koo, Suwon-si (KR); Sung Ryong Ma, Suwon-si (KR); Sung Jin Park, Suwon-si (KR); Ha Yoon Song, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 88 days.

(21) Appl. No.: 15/798,312

(22) Filed: Oct. 30, 2017

(65) Prior Publication Data
US 2018/0234074 A1 Aug. 16, 2018

(30) Foreign Application Priority Data

Feb. 13, 2017 (KR) .................. 10-2017-0019601

(51) Int. Cl.
| | |
|---|---|
| *H03H 7/42* | (2006.01) |
| *H01F 27/29* | (2006.01) |
| *H03H 1/00* | (2006.01) |
| *H01F 27/255* | (2006.01) |
| *H01F 27/28* | (2006.01) |
| *H01F 3/10* | (2006.01) |

(Continued)

(52) U.S. Cl.
CPC ............ *H03H 7/427* (2013.01); *H01F 3/10* (2013.01); *H01F 17/0013* (2013.01); *H01F 27/255* (2013.01); *H01F 27/2804* (2013.01); *H01F 27/29* (2013.01); *H01F 27/292* (2013.01); *H03H 1/00* (2013.01); *H01F 27/245* (2013.01); *H01F 2003/106* (2013.01); *H01F 2017/0093* (2013.01); *H03H 2001/0092* (2013.01)

(58) Field of Classification Search
CPC . H03H 7/427; H03H 2001/0085; H01F 27/29
USPC .................................................. 333/181, 185
See application file for complete search history.

(56) References Cited

U.S. PATENT DOCUMENTS

| | | | |
|---|---|---|---|
| 2013/0169381 A1* | 7/2013 | Kim ..................... | H03H 7/427 333/185 |
| 2015/0170786 A1 | 6/2015 | Hong et al. | |

(Continued)

FOREIGN PATENT DOCUMENTS

| | | |
|---|---|---|
| KR | 10-2015-0068622 A | 6/2015 |
| KR | 10-2016-0066826 A | 6/2016 |

*Primary Examiner* — Rakesh B Patel
(74) *Attorney, Agent, or Firm* — Morgan, Lewis & Bockius LLP

(57) ABSTRACT

A common mode filter includes: a body including a filter portion; first and second external electrodes each including an electrode layer including conductive particles, intermetallic compound (IMC) formation particles, and a resin, and disposed on an external surface of the body; and first and second coils disposed in the filter portion, the first and second coils being connected through lead portions to the electrode layers of the first and second external electrodes, respectively. The conductive particles include a first conductive particle and a second conductive particle having a diameter smaller than that of the first conductive particle.

12 Claims, 7 Drawing Sheets

(51) Int. Cl.
*H01F 17/00* (2006.01)
*H01F 27/245* (2006.01)

(56) References Cited

U.S. PATENT DOCUMENTS

2016/0164483 A1 6/2016 Park et al.
2017/0032896 A1* 2/2017 Otani ........................ H01G 4/30
2017/0133144 A1* 5/2017 Lee ........................... H01F 1/36

* cited by examiner

COMMON MODE FILTER

CROSS-REFERENCE TO RELATED APPLICATION(S)

This application claims the benefit of priority to Korean Patent Application No. 10-2017-0019601, filed on Feb. 13, 2017 in the Korean Intellectual Property Office, the disclosure of which is incorporated herein by reference in its entirety.

BACKGROUND

1. Field

The present disclosure relates to a common mode filter.

2. Description of Related Art

With the advancement of various technologies, electronic devices such as mobile phones, home appliances, PCs, PDAs, LCDs, and the like, have changed from analog-type devices to digital-type devices and have tended to have higher processing rates due to an increase in amounts of data processed thereby. In line with this, USB 2.0, USB 3.0, and high-definition multimedia interface (HDMI) have become prevalent as high- speed signal transmission interfaces and have been incorporated into digital devices such as personal computers and digital HD televisions.

These high-speed interfaces employ a differential signal system which transmits a differential signal (differential mode signal) using a pair of signal lines, unlike single-end transmission systems which have generally been used in the related art. However, high-speed digitalized electronic devices are sensitive to external stimuli, involving frequent signal distortion due to high frequency noise.

Abnormal voltage and noise, which may result from a switching voltage generated in a circuit, power noise included in a source voltage, an unnecessary electromagnetic signal, electromagnetic noise, and the like, must be removed, and a common mode filter (CMF) is used to prevent the introduction of such abnormal voltage and high frequency noise to a circuit.

SUMMARY

An aspect of the present disclosure may provide a common mode filter in which connectivity between a lead portion of a coil and an electrode layer of an external electrode are enhanced and a plating layer is easily formed on the electrode layer of the external electrode.

According to an aspect of the present disclosure, a common mode filter includes: a body including a filter portion; first and second external electrodes each including an electrode layer including conductive particles, intermetallic compound (IMC) formation particles, and a resin, and disposed on an external surface of the body; and first and second coils disposed in the filter portion, the first and second coils being connected through lead portions to the electrode layers of the first and second external electrodes, respectively. The conductive particles include a first conductive particle and a second conductive particle having a diameter smaller than that of the first conductive particle.

According to another aspect of the present disclosure, a common mode filter includes: a body including a filter portion; first and second external electrodes each including an electrode layer including conductive particles, intermetallic compound (IMC) formation particles, and a resin, and disposed on an external surface of the body; first and second coils disposed in the filter portion, the first and second coils being connected through lead portions to the electrode layers of the first and second external electrodes, respectively; and an intermetallic compound (IMC) layer disposed between the electrode layer and the lead portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Exemplary embodiments in the present disclosure will now be described in detail with reference to the accompanying drawings.

Figure 1:
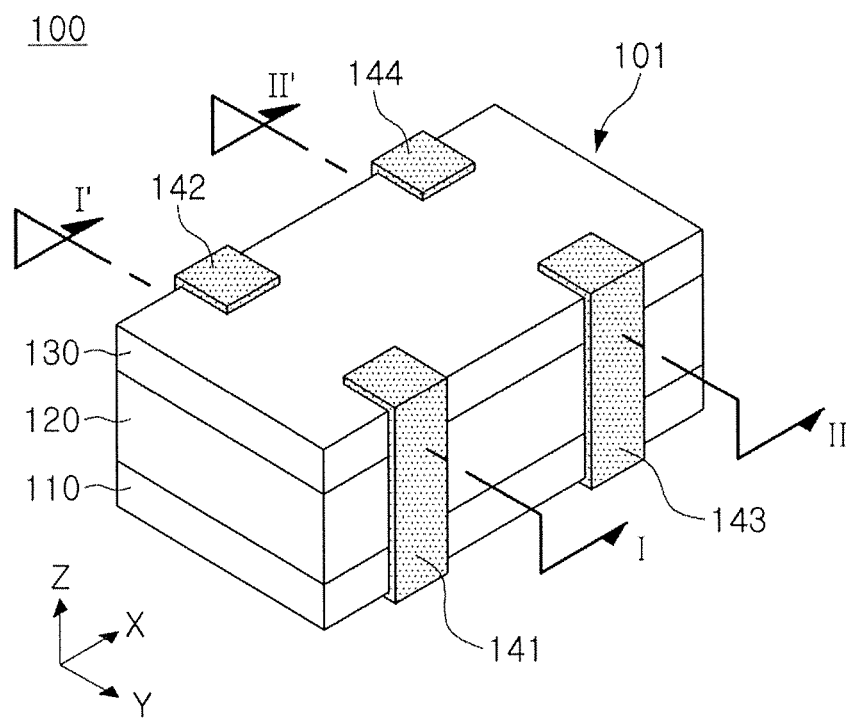
FIG. 1 is a schematic perspective view of a common mode filter according to an exemplary embodiment in the present disclosure.
Figure 2:
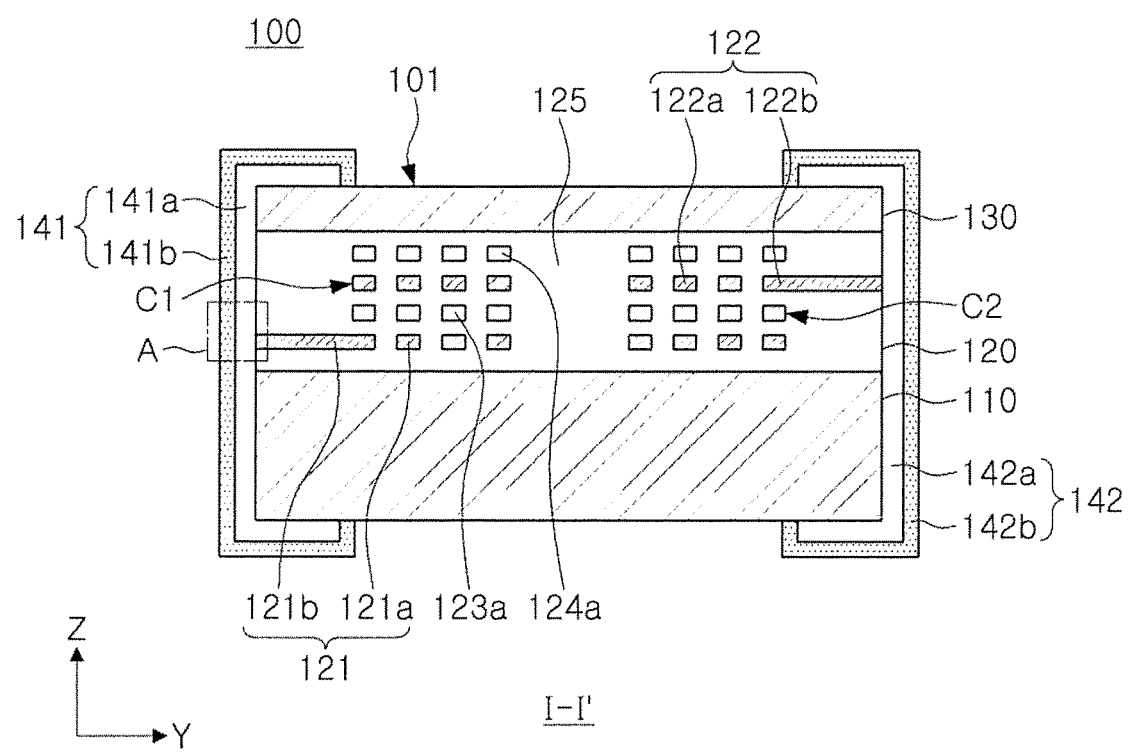
FIG. 2 is a cross-sectional view taken along line I-I' of FIG. 1.
Figure 3:
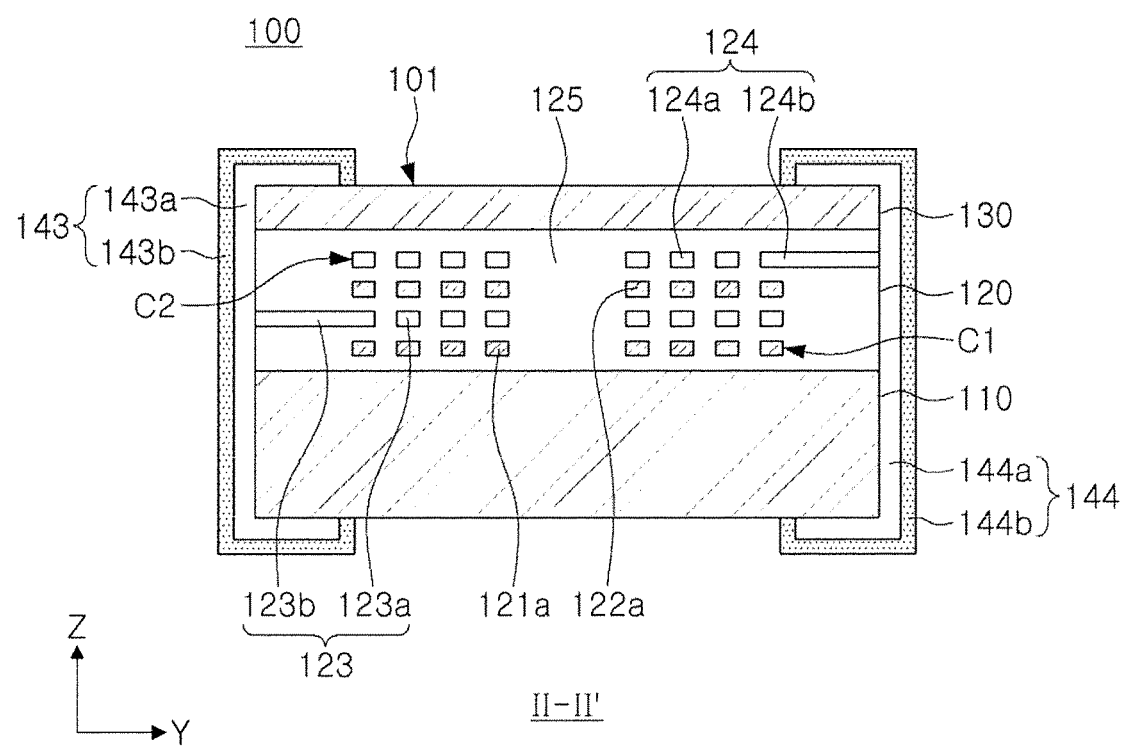
FIG. 3 is a cross-sectional view taken along line II-II' of FIG. 1.

FIG. 1 is a schematic perspective view of a common mode filter according to an exemplary embodiment in the present disclosure, FIG. 2 is a cross-sectional view taken along line I-I' of FIG. 1, and FIG. 3 is a cross-sectional view taken along line II-II' of FIG. 1.

A structure of a common mode filter 100 according to an exemplary embodiment in the present disclosure will be described with reference to FIGS. 1 to 3.

The common mode filter 100 according to an exemplary embodiment in the present disclosure includes a body 101 and a plurality of external electrodes 141, 142, 143, and 144 disposed on an external surface of the body 101.

The external electrodes 141, 142, 143, and 144 may include first to fourth external electrodes 141, 142, 143, and 144 and may be spaced apart from each other.

As illustrated in FIG. 1, the external electrodes 141, 142, 143, and 144 may be disposed on side surfaces of the body 101 but are not limited thereto and the external electrodes 141, 142, 143, and 144 may also be disposed on a lower surface of the body 101.

The external electrodes 141, 142, 143, and 144 are connected to coils C1 and C2 (to be described hereinafter) to input or output a signal.

The external electrodes 141, 142, 143, and 144 includes electrode layers 141a, 142a, 143a, and 144a and plating layers 141b, 142b, 143b, and 144b, respectively. The electrode layers 141a, 142a, 143a, and 144a and the plating layers 141b, 142b, 143b, and 144b will be described hereinafter.

The body 101 includes a magnetic substrate 110, a filter portion 120, and a cover part 130.

The magnetic substrate 110 is positioned in a lowermost layer of the common mode filter 100 and is formed of a magnetic material. The magnetic substrate 110 may include at least one of a metal, a polymer, and ceramics as a magnetic material. For example, the magnetic substrate 110 may be a ferrite substrate but is not limited thereto.

The filter portion 120 is disposed on the magnetic substrate 110.

The filter portion 120 includes first and second coils C1 and C2.

The first coil C1 may be formed as a first coil pattern 121 and a second coil pattern 122 connected through a conductive via.

The first coil pattern 121 includes a first capacity part 121a which is spirally formed and a first lead portion 121b electrically connecting the first capacity part 121a and the first external electrode 141. The second coil pattern 122 includes a second capacity part 122a which is spirally formed and a second lead portion 122b electrically connecting the second capacity part 122a and the second external electrode 142.

The second coil C2 may be formed as a third coil pattern 123 and a fourth coil pattern 124 connected to each other through a conductive via.

The third coil pattern 123 includes a third capacity part 123a which is spirally formed and a third lead portion 123b electrically connecting the third capacity part 123a and the third external electrode 143. The fourth coil pattern 124 includes a fourth capacity part 124a which is spirally formed and a fourth lead portion 124b electrically connecting the fourth capacity part 124a and the fourth external electrode 144.

Opposing end portions of the first coil C1 may be electrically connected to the first and second external electrodes 141 and 142 through the first and second lead portions 121b and 122b, respectively, and opposing end portions of the second coil C2 may be electrically connected to the third and fourth external electrodes 143 and 144 through the third and fourth lead portions 123b and 124b, respectively.

The first and second coils C1 and C2 may be configured such that spiral electrode patterns are wound in the same direction.

Since the first and second coils C1 and C2 are configured such that electrode patterns are wound in the same direction, when a signal flows in the first and second coils C1 and C2, the first and second coils C1 and C2 may act as resistors for a common mode signal, reducing common mode noise.

The first and second coils C1 and C2 are disposed in a spiral shape and include a metal with excellent conductivity. For example, the first and second coils C1 and C2 may be formed of one of metals included in intermetallic compound (IMC) formation particles. For example, when the IMC formation particles are Ag—Sn—Cu solder, the first and second coils C1 and C2 may be formed of copper (Cu) but are not limited thereto.

That is, when the first and second coils C1 and C2 are formed of the same metal as that included in the IMC formation particles, the first and second coils C1 and C2 may be formed of silver (Ag), palladium (Pd), aluminum (Al), nickel (Ni), titanium (Ti), gold (Au), copper (Cu), platinum (Pt), or alloys thereof, but are not limited thereto.

Since the first and second coils C1 and C2 according to an exemplary embodiment in the present disclosure are formed of one of metals included in the IMC formation particles, an IMC layer may be formed between the lead portions 121b, 122b, 123b, and 124b of the first and second coils C1 and C2 and electrode layers included in the external electrodes 141, 142, 143, and 144 to enhance contact characteristics and connectivity between the external electrodes 141, 142, 143, and 144 and the first and second coils C1 and C2.

The first and second coils C1 and C2 may be formed using a plating method, a printing method, a photolithography method, and the like, but are not limited thereto.

The magnetic layer 125 may be disposed around the first and second coils C1 and C2 of the filter portion 120. The magnetic layer 125 may be formed by compressing ferrite sheets or using a complex obtained by dispersing magnetic particles in a resin. As necessary, an insulating layer may be disposed between the magnetic layer 125 and the first and second coils C1 and C2.

The cover part 130 may be disposed on the filter portion 120.

The cover part 130 may be positioned on an uppermost layer of the common mode filter 100 and formed of a magnetic substance. The cover part 130 may include at least one of a metal, a polymer, and a ceramic as a material having magnetism.

For example, the cover part 130 may be a ferrite sheet but is not limited thereto.

Figure 4:
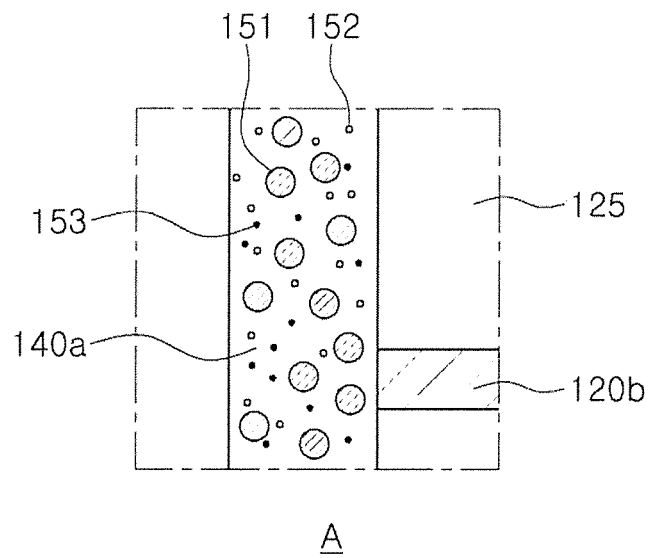
FIG. 4 is a schematic enlarged cross-sectional view of portion "A" of FIG. 2, illustrating an external electrode before an IMC layer is formed.
Figure 5:
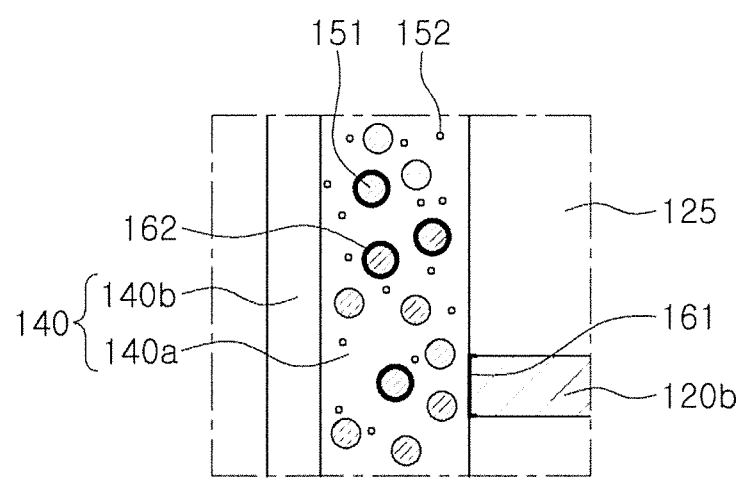
FIG. 5 is a schematic enlarged cross-sectional view of portion "A" of FIG. 2, illustrating an external electrode after an IMC layer and a plating layer are formed.

FIG. 4 is a schematic enlarged cross-sectional view of portion "A" of FIG. 2, illustrating an external electrode before an IMC layer is formed, and FIG. 5 is a schematic enlarged cross-sectional view of portion "A" of FIG. 2, illustrating an external electrode after an IMC layer and a plating layer are formed.

Hereinafter, contents described with reference to FIGS. 4 and 5 may be applied to at least one of the first to fourth external electrodes 141, 142, 143, and 144, and here, for the purposes of description, a lead portion 120b, an external electrode 140, an electrode layer 140a, and a plating layer 140b of FIGS. 4 and 5 will be described.

Referring to FIG. 4, the external electrode 140 includes an electrode layer 140a.

The electrode layer 140a of the common mode filter 100 according to an exemplary embodiment in the present disclosure includes conductive particles 151 and 152, IMC formation particles 153, and a resin.

The resin may be an epoxy but is not limited thereto.

The conductive particles 151 and 152 include a first conductive particle 151 and a second conductive particle 152 having a diameter smaller than that of the first conductive particle 151. Here, the diameter of the second conductive particle 152 may be 10% to 50% of the diameter of the first conductive particle 151. The diameter of the first conductive particle 151 may be 1.5 μm to 2 μm, and the diameter of the second conductive particle 152 may be 100 nm to 300 nm.

The conductive particles 151 and 152 may be formed of a metal having excellent electrical conductivity and may be formed of one of metals included in the IMC formation particles (to be described hereinafter), for example. For example, in cases where the IMC formation particles are Ag—Sn—Cu solder, the conductive particles 151 and 152 may be formed of silver (Ag) but are not limited thereto.

That is, when the conductive particles 151 and 152 are formed of one of metals included in the IMC formation particles, the conductive particle 151 and 152 maybe formed of silver (Ag), palladium (Pd), aluminum (Al), nickel (Ni), titanium (Ti), gold (Au), copper (Cu), platinum (Pt), and alloys thereof, but are not limited thereto.

The IMC formation particle 153 may be solder having a low melting point of 450° C. or lower. For example, the solder may be Ag—Sn—Cu solder. When the IMC formation particle 153 used in the common mode filter 100 according to an exemplary embodiment in the present disclosure is Ag—Sn—Cu solder, the IMC formation particle 153 may include 96.5 at % of Sn, 3.0 at % of Ag, and 0.5 at % of Cu but is not limited thereto.

In an electrode layer composition for forming the electrode layer 140a, the content of the conductive particles 151 and 152 may be 60 vol % to 80 vol %, the content of the IMC formation particles 153 may be 10 vol % to 30 vol %, and the remainder of the electrode layer composition maybe filled with a resin.

If the content of the conductive particles 151 and 152 is less than 60 vol %, direct current resistance (Rdc) characteristics of the common mode filter 100 may be degraded, and if the content of the conductive particles 151 and 152 exceeds 80 vol %, an amount in which the conductive particles 151 and 152 and the liquid IMC formation particles 153 react with each other may be increased to reduce a degree of IMC formation of the IMC layer formed in the electrode layer 140a and the lead portion 120b to below 90%.

Thus, in the electrode layer composition for forming the electrode layer 140a, the content of the conductive particles 151 and 152 is set to 60 vol % to 80 vol % to enhance the Rdc characteristics of the common mode filter 100 and the degree of IMC formation of the IMC layer formed in the electrode layer 140a and the lead portion 120b is increased to 90% or greater to also enhance the Rdc characteristics of the common mode filter 100.

If the content of the IMC formation particles 153 is less than 10 vol %, the degree of IMC formation as described hereinafter may be reduced to below than 90%, and if the content of the IMC formation particles 153 exceeds 30 vol %, reactivity between the conductive particles 151 and 152 and the liquid IMC formation particles is increased to reduce an area of the conductive particles 151 and 152 exposed to a surface of the electrode layer 140a to below 30 vol % to degrade plating characteristics.

Thus, in the electrode layer composition for forming the electrode layer 140a, the content of the IMC formation particles 153 may be set to 10 to 30 vol % to increase the degree of IMC formation of the IMC layer formed in the electrode layer 140a and the lead portion 120b to 90% or greater to enhance the Rdc characteristics of the common mode filter 100 and simultaneously increase an area of the conductive particles 151 and 152 exposed to the surface of the electrode layer 140a to 30% or greater per unit area to enhance plating characteristics.

Formation of an IMC layer in a portion in which the lead portion 120b and the electrode layer 140 are in contact will be described with reference to FIGS. 4 and 5.

IMC refers to a material generated when joining solids with solder as an intermediate insert metal. The solder used herein refers to a material having a melting point of 450° C. or lower.

The IMC, joining solids, is required to have excellent heat and electric conductivity and mechanical strength of a predetermined level or higher.

Since the common mode filter 100 according to an exemplary embodiment in the present disclosure includes the IMC formation particles 153 in the electrode layer 140a, an INC layer may be formed between the lead portion 120b and the electrode layer 140a.

A process of forming the IMC layer between the lead portion 120b and the electrode layer 140a by the IMC formation particles 153 is as follows.

As illustrated in FIG. 4, the conductive particles 151 and 152 and the IMC formation particles 153 are dispersed in a resin and applied to a portion of an external surface of the body to which the lead portion 120b is exposed.

Thereafter, the electrode layer 140a is heated to a melting point of the IMC formation particle 153. When the IMC formation particle 153 is heated to a melting point thereof, the IMC formation particle 153 is melted to a liquid phase, and the liquid IMC formation particles 153 are spread to the lead portion 120b.

As the liquid IMC formation particles 153 are spread to the lead portion 120b, a portion of a solid IMC layer is formed in the liquid.

Finally, as the liquid IMC formation particles 153 are gradually consumed, an IMC layer 161 is formed between the electrode layer 140a and the lead portion 120b as illustrated in FIG. 5.

In cases where the IMC formation particles 153 are Ag—Sn—Cu solder and the coils C1 and C2 are formed of copper, Cu and Sn may form a transient liquid phase junction. That is, when the IMC formation particles 153 are heated to a melting point of the Ag—Sn—Cu solder, the IMC formation particles 153 are changed in phase to a liquid phase to form the IMC layer 161 of Cu—Sn. Here, referring to FIG. 7, since Sn of the liquid is spread to form the IMC layer 161 of Cu—Sn, the IMC layer 161 of a portion close to the lead portion 120b, i.e. , the IMC layer 161 of a potion in contact with the lead portion 120b, is formed as a first IMC layer 161a including $Cu_3Sn$ and the IMC layer 161 of a portion away from the lead portion 120b, i.e., the IMC layer 161 a portion in contact with the electrode layer 140a is formed as a second IMC layer 161b including $Cu_6Sn_5$. Thus, when a widely known binary state diagram of Cu—Sn is checked, it can be seen that the formed IMC layer 161 has a melting point higher than that of pure Sn. Thus, the IMC layer 161 will not be re-melted although it is re-heated at a temperature at which the IMC layer 161 was formed.

In the related art, an external electrode is formed by applying an epoxy with silver dispersed therein to a portion of a body to which a lead portion of a coil is exposed. In such a case, due to a difference in coefficient of thermal expansion between the lead portion of the coil and the external electrodes formed of the Ag-dispersed epoxy, adhesion is weakened to increase Rdc of the common mode filter.

In contrast, in the common mode filter 100 according to an exemplary embodiment in the present disclosure, since the electrode layer 140a included in the external electrode 140 includes the IMC formation particles 153 to form the IMC layer 161 between the electrode layer 140a and the lead portion 120b, adhesion and connectivity between the electrode layer 140a and the lead portion 120b may be enhanced to lower Rdc of the common mode filter 100.

Here, however, the IMC formation particles 153 may also react to the conductive particles 151 and 152, as well as to the lead portion of the coil, reducing an area of the conductive particles 151 and 152 exposed to a surface of the electrode layer. That is, the IMC formation particles 153 may form outer layers 162 on the conductive particles 151 and 152. This may reduce the area of the conductive particles 151 and 152 exposed to the surface of the electrode layer. When the area of the conductive particles exposed to the surface of the electrode layer is reduced, plating may not be properly performed on the electrode layer, increasing a possibility of defective plating.

For example, in cases where IMC formation particles are Ag—Sn—Cu solder and the conductive particles are Ag, the conductive particles and Sn of the Ag—Sn—Cu solder are bonded during a process of forming the IMC layer to form $Ag_3Sn$ 152 (please refer to FIG. 5). Due to this, the area of the conductive particles exposed to the surface of the electrode layer may be reduced to make it difficult to properly perform plating, causing defect plating.

However, in the common mode filter 100 according to an exemplary embodiment in the present disclosure, since the conductive particles 151 and 152 include the first conductive particle 151 and the second conductive particle 152 having a diameter smaller than that of the first conductive particle 151, reaction between the IMC formation particles 153 and the conductive particles 151 and 152 may be reduced to increase an area of the conductive particles 151 and 152 exposed to the electrode layer to 30% or greater per unit area to enhance plating characteristics, and since the IMC layer 161 is formed between the lead portion 120b and the electrode layer 140a, Rdc of the common mode filter 100 may be reduced.

Enhancement of plating characteristics by including the first conductive particle 151 and the second conductive particle 152 having a diameter smaller than that of the first conductive particle 151 in the conductive particles 151 and 152 will be described with reference to FIG. 6.

Figure 6:
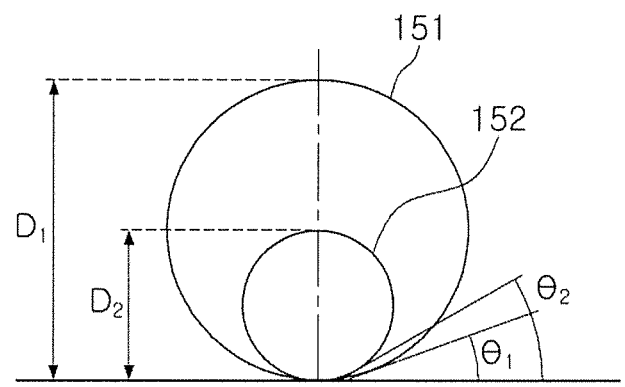
FIG. 6 is a schematic view illustrating a change in a contact angle according to sizes of a conductive particle.

FIG. 6 is a schematic view illustrating a change in a contact angle according to sizes of a conductive particle.

Referring to FIG. 6, it can be seen that a diameter $D_1$ of the first conductive particle 151 is greater than a diameter $D_2$ of the second conductive particle 152, and thus, it can be seen that a contact angle $\theta_1$ in relation to a contact surface of the first conductive particle 151 is smaller than a contact angle $\theta_2$ in relation to a contact surface of the second conductive particle 152.

As the contact angle in relation to the contact surface of the conductive particle is reduced, wettability between the liquid IMC formation particles and the conductive particles is enhanced. That is, wettability of the liquid of the second conductive particle 152 having a diameter smaller than that of the first conductive particle 151 with respect to the IMC formation particle is lower than that of the first conductive particle 151. Thus, in the common mode filter 100 according to an exemplary embodiment in the present disclosure, since the second conductive particle 152 having a diameter smaller than that of the first conductive particle 151 is included in the electrode layer 140a, the conductive particles 151 and 152 not reacting to the IMC formation particles 153, among the conductive particles 151 and 152, remain to increase the area in which the conductive particles 151 and 152 are exposed to the surface of the electrode layer 140a, enhancing plating characteristics.

The plating layer 140b may be formed on the surface of the electrode layer 140a to which the conductive particles 151 and 152 are exposed, through a plating method. The plating layer 140b may be formed of a metal having excellent conductivity, e.g., copper, silver, gold, palladium, nickel, and the like, but is not limited thereto.

Table 1 below shows measurement of a degree of IMC formation with respect to the lead portion of the coil according to volume ratios of the first and second conductive particles 151 and 152 and an exposed area of conductive particles to a surface of the electrode layer of the external electrode.

TABLE 1

| Sample | Volume ratio of each conductive particle to total volume of first and second conductive particles | | Degree of IMC formation (%) | Exposed area of conductive particle (%) |
|---|---|---|---|---|
| | First conductive particle | Second conductive particle | | |
| 1 | 10 | 90 | 21 | 78 |
| 2 | 20 | 80 | 32 | 71 |
| 3 | 30 | 70 | 50 | 64 |
| 4 | 40 | 60 | 75 | 61 |
| 5 | 50 | 50 | 79 | 52 |
| 6 | 55 | 45 | 89 | 45 |
| 7 | 60 | 40 | 92 | 39 |
| 8 | 70 | 30 | 94 | 31 |
| 9 | 75 | 25 | 98 | 27 |
| 10 | 80 | 20 | 100 | 22 |
| 11 | 90 | 10 | 100 | 19 |
| 12 | 95 | 5 | 100 | 17 |

Figure 7:
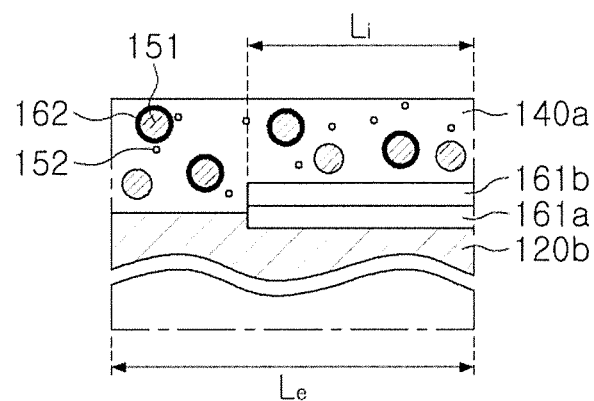
FIG. 7 is a schematic view illustrating a method for evaluating a degree of formation of an IMC layer.
Figure 8:
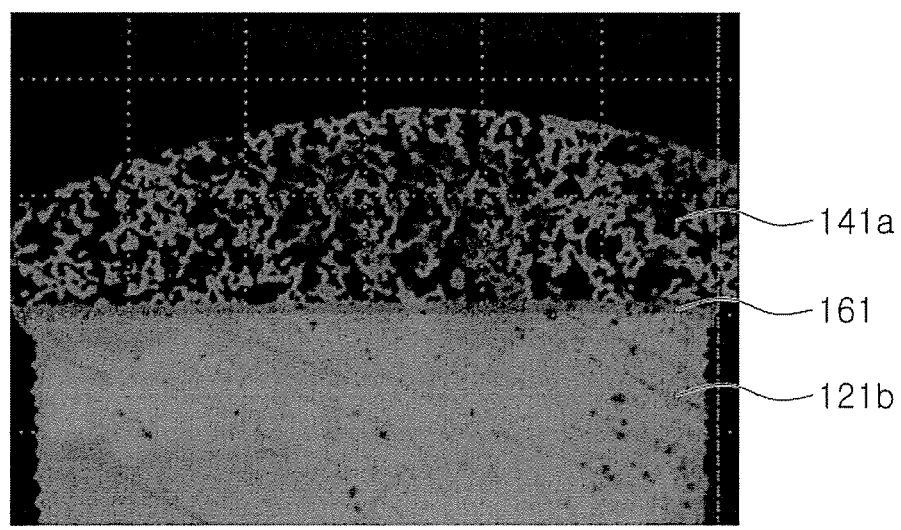
FIG. 8 is a photograph of a cross-section of an external electrode and a lead portion of a common mode filter according to an exemplary embodiment in the present disclosure.

FIG. 7 is a schematic view illustrating a method for evaluating a degree of formation of an IMC layer, and FIG. 8 is a photograph of a cross-section of an external electrode and a lead portion of a common mode filter according to an exemplary embodiment in the present disclosure.

A method for evaluating a degree of IMC formation of Table 1 will be described with reference to FIGS. 7 and 8. After 100 chips of each sample were formed, a degree of IMC formation was measured by measuring a length $L_i$ of the formed IMC layers 161a and 161b with respect to a length $L_e$ of an exposed portion of the lead portion 120b. Here, a degree of IMC formation in cases in which the IMC layer 161 is formed entirely on the exposed portion of the first lead portion 121b, like the first lead portion 121b of FIG. 8, is 100%.

Figure 9A:
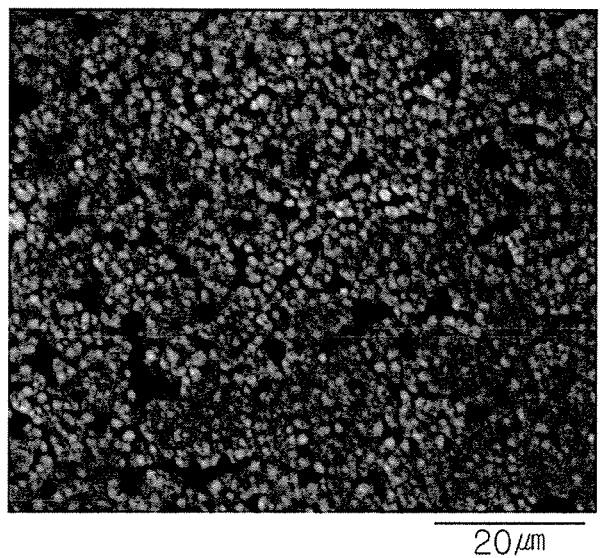
FIG. 9A is a photograph of a surface of an electrode layer of a common mode filter according to an exemplary embodiment in the present disclosure.
Figure 9B:
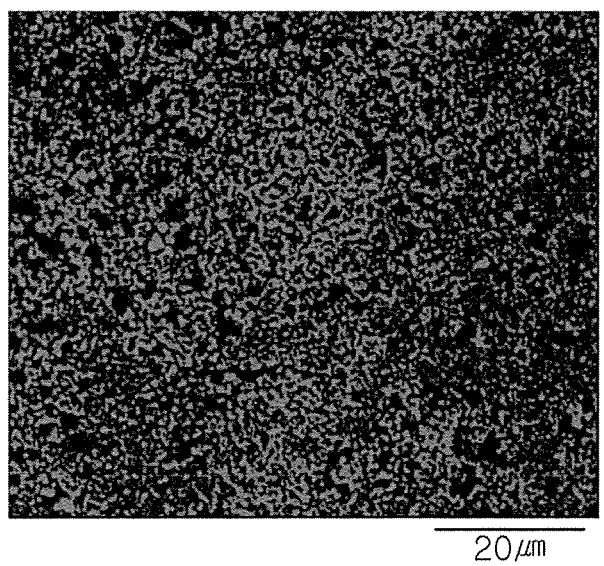
FIG. 9B is a view illustrating a region of a surface of an electrode layer to which conductive particles are exposed.

FIG. 9A is a photograph of a surface of an electrode layer of a common mode filter according to an exemplary embodiment in the present disclosure, and FIG. 9B is a view illustrating a region of a surface of an electrode layer of FIG. 9A to which conductive particles are exposed.

Referring to FIGS. 9A and 9B, regarding exposed areas of the conductive particles of Table 1, after 100 chips of each sample were formed, an area % of the exposed surface of the electrode layer 140a was measured through ESD analysis.

Referring to Table 1, when a volume ratio of the first conductive particles to a total volume of the first and second conductive particles 151 and 152 included in the electrode layer 140a is 0.55 or less, a degree of IMC formation is below 90%, reducing contact characteristics and connectivity between the electrode layer 140a and the lead portion 120b to increase Rdc of the common mode filter. Also, when a volume ratio of the first conductive particles to a total volume of the first and second conductive particles 151 and 152 included in the electrode layer 140a is equal to or greater than 0.75, an area of the conductive particles 151 and 152 exposed to the surface of the electrode layer 140a is reduced to below 30% per unit area, making it difficult to properly perform plating to form a plating layer, reducing plating characteristics.

Thus, in the common mode filter according to an exemplary embodiment in the present disclosure, since the volume ratio of the first conductive particles 151 to the total volume of the first and second conductive particles 151 and 152 included in the electrode layer 140a exceeds 0.55 but is less than 0.75, the IMC layer 161 is formed between the electrode layer 140a and the lead portion 120b to increase contact characteristics and connectivity to reduce Rdc of the common mode filter 100, and also, since the area of the conductive particles 151 and 152 exposed to the surface of the electrode layer 140*a* is secured to be 30% or greater per unit area, facilitating formation of a plating layer to enhance plating characteristics.

As set forth above, in the common mode filter according to an exemplary embodiment in the present disclosure, since the electrode layer of the external electrode includes the conductive particles, the IMC formation particles, and the resin and the conductive particles include the first conductive particle and the second conductive particle having a diameter smaller than that of the first conductive particle, connectivity between the lead portion of the coil and the electrode layer of the external electrode may be enhanced and a plating layer may be easily formed on the electrode layer of the external electrode.

While exemplary embodiments have been shown and described above, it will be apparent to those skilled in the art that modifications and variations could be made without departing from the scope of the present invention as defined by the appended claims.

What is claimed is:

1. A common mode filter comprising:
   a body including a filter portion;
   first and second external electrodes each including an electrode layer including conductive particles, intermetallic compound (IMC) formation particles, and a resin, and disposed on an external surface of the body; and
   first and second coils disposed in the filter portion, the first and second coils being connected through lead portions to the electrode layers of the first and second external electrodes, respectively,
   wherein the conductive particles include a first conductive particle and a second conductive particle having a diameter smaller than that of the first conductive particle, and
   wherein a diameter of the second conductive particle is within a range from 10% to 50% of a diameter of the first conductive particle.

2. The common mode filter of claim 1, wherein an intermetallic compound (IMC) layer is disposed between the electrode layer of each of the first and second external electrodes and the corresponding lead portion.

3. The common mode filter of claim 1, wherein each of the first and second external electrodes further include: a plating layer disposed on the corresponding electrode layer.

4. The common mode filter of claim 1, wherein a volume ratio of the first conductive particle to a total volume of the first and second conductive particles included in the electrode layer of each of the first and second external electrodes exceeds 0.55 and is less than 0.75.

5. The common mode filter of claim 1, wherein the content of the IMC formation particles to a total content of a composition forming the electrode layer of each of the first and second external electrodes is within a range from 10 vol % to 30 vol %.

6. The common mode filter of claim 1, wherein an area of the conductive particles exposed to a surface of the electrode layer of each of the first and second external electrodes is 30% or greater per unit area.

7. A common mode filter comprising:
   a body including a filter portion;
   first and second external electrodes each including an electrode layer including conductive particles, intermetallic compound (IMC) formation particles, and a resin, and disposed on an external surface of the body;
   first and second coils disposed in the filter portion, the first and second coils being connected through lead portions to the electrode layers of the first and second external electrodes, respectively; and
   an intermetallic compound (IMC) layer disposed between the electrode layer of each of the first and second external electrodes and the corresponding lead portion,
   wherein the conductive particles include a first conductive particle and a second conductive particle having a diameter smaller than that of the first conductive particle, and
   wherein a diameter of the second conductive particle is within a range from 10% to 50% of a diameter of the first conductive particle.

8. The common mode filter of claim 7, wherein a volume ratio of the first conductive particle to a total volume of the first and second conductive particles included in the electrode layer of each of the first and second external electrodes exceeds 0.55 and is less than 0.75.

9. The common mode filter of claim 7, wherein each of the IMC layers include a first IMC layer disposed to be in contact with the corresponding lead portion and a second IMC layer disposed to be in contact with the corresponding electrode layer.

10. The common mode filter of claim 9, wherein the first IMC layer of each of the IMC layers includes Cu3Sn and the second IMC layer includes Cu6Sn5.

11. The common mode filter of claim 7, wherein an area of the conductive particles exposed to the surface of the electrode layer of each of the first and second external electrodes is 30% or greater per unit area.

12. The common mode filter of claim 8, wherein each of the first and second external electrodes further include: a plating layer disposed on the corresponding electrode layer.

* * * * *